US011672154B2

United States Patent
Jung et al.

(10) Patent No.: US 11,672,154 B2
(45) Date of Patent: Jun. 6, 2023

(54) OPTICAL FILTER SUBSTRATE AND DISPLAY DEVICE INCLUDING THE SAME

(71) Applicant: Samsung Display Co., Ltd., Yongin-Si (KR)

(72) Inventors: Euisuk Jung, Yongin-si (KR); Jihyun Kim, Yongin-si (KR); Junhong Park, Yongin-si (KR); Jun Chun, Yongin-si (KR); Hoon Kang, Yongin-si (KR); Jeongmin Park, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 93 days.

(21) Appl. No.: 17/242,387

(22) Filed: Apr. 28, 2021

(65) Prior Publication Data

US 2021/0249479 A1  Aug. 12, 2021

Related U.S. Application Data

(63) Continuation of application No. 16/555,921, filed on Aug. 29, 2019, now Pat. No. 11,004,910.

(30) Foreign Application Priority Data

Oct. 26, 2018 (KR) .......................... 10-2018-0129334

(51) Int. Cl.
*H10K 50/115* (2023.01)
*H10K 59/38* (2023.01)
(Continued)

(52) U.S. Cl.
CPC ............ *H01L 27/322* (2013.01); *G02B 5/201* (2013.01); *H01L 27/3246* (2013.01);
(Continued)

(58) Field of Classification Search
CPC . H01L 27/322; H01L 51/5284; H01L 51/502; H01L 51/504; H01L 51/5268; H01L 51/5275
See application file for complete search history.

(56) References Cited

U.S. PATENT DOCUMENTS 8,228,466 B2  7/2012  Kang et al.
8,665,401 B2  3/2014  Kim et al.
(Continued)

FOREIGN PATENT DOCUMENTS

CN  104377226 A  2/2015
CN  104536198 A  4/2015
(Continued)

*Primary Examiner* — Errol V Fernandes
*Assistant Examiner* — Jeremy J Joy
(74) *Attorney, Agent, or Firm* — Innovation Counsel LLP

(57) ABSTRACT

A display device includes an optical filter substrate including: a substrate; a first color filter on the substrate; a second color filter on the substrate, the second color filter spaced apart from the first color filter; a first color conversion element on the first color filter, the first color conversion element converting incident light into light of a first color; a second color conversion element on the second color filter, the second color conversion element converting the incident light into light of a second color; and a black matrix located between the first color conversion element and the second color conversion element, and between the first color filter and the second color filter.

13 Claims, 14 Drawing Sheets

(51) Int. Cl.
*H10K 50/13*      (2023.01)
*H01L 27/32*      (2006.01)
*H01L 51/50*      (2006.01)
*H01L 51/52*      (2006.01)
*H01L 51/00*      (2006.01)
*G02B 5/20*       (2006.01)
*G09F 9/33*       (2006.01)

(52) U.S. Cl.
CPC ........ *H01L 51/0024* (2013.01); *H01L 51/502* (2013.01); *H01L 51/504* (2013.01); *H01L 51/5284* (2013.01); *G09F 9/33* (2013.01)

(56) References Cited

U.S. PATENT DOCUMENTS

| | | | |
|---|---|---|---|
| 9,703,191 B2* | 7/2017 | Park | G03F 7/20 |
| 10,042,206 B2 | 8/2018 | Nagayama et al. | |
| 10,079,252 B2 | 9/2018 | Lee et al. | |
| 10,084,147 B2 | 9/2018 | Liu et al. | |
| 10,361,179 B2 | 7/2019 | Lin et al. | |
| 10,739,502 B2* | 8/2020 | Baek | H01L 51/5275 |
| 11,126,029 B2* | 9/2021 | Jung | H01L 27/3244 |
| 2005/0094061 A1 | 5/2005 | Lee et al. | |
| 2007/0090755 A1* | 4/2007 | Eida | H01L 27/322 313/506 |
| 2015/0048348 A1* | 2/2015 | Huang | G02F 1/133514 257/40 |
| 2015/0171372 A1* | 6/2015 | Iwata | H01L 27/153 257/89 |
| 2015/0185381 A1* | 7/2015 | Wu | G02F 1/133617 |
| 2016/0041430 A1* | 2/2016 | Lee | G02F 1/133514 349/96 |
| 2016/0190515 A1* | 6/2016 | Huang | G02B 5/201 257/13 |
| 2017/0059985 A1* | 3/2017 | Park | G02B 5/201 |
| 2017/0076678 A1* | 3/2017 | Lee | G02F 1/1336 |
| 2017/0153368 A1* | 6/2017 | Yoon | G02B 5/28 |
| 2017/0176816 A1* | 6/2017 | Han | G02B 5/207 |
| 2017/0358503 A1* | 12/2017 | Liu | B65G 43/08 |
| 2018/0006093 A1* | 1/2018 | Kim | H01L 33/06 |
| 2018/0017829 A1 | 1/2018 | Chae et al. | |
| 2018/0045866 A1 | 2/2018 | Chae et al. | |
| 2018/0088404 A1* | 3/2018 | Chae | G02F 1/133514 |
| 2018/0120631 A1* | 5/2018 | Lee | G02F 1/133617 |
| 2018/0156951 A1* | 6/2018 | Baek | G02F 1/133512 |
| 2018/0180935 A1* | 6/2018 | Kim | G02F 1/133617 |
| 2018/0202616 A1* | 7/2018 | Yoon | F21K 9/64 |
| 2018/0210282 A1* | 7/2018 | Song | H01L 33/505 |
| 2018/0341147 A1* | 11/2018 | Sugitani | G02F 1/133617 |
| 2019/0025638 A1* | 1/2019 | Kim | G02F 1/133602 |
| 2019/0121176 A1* | 4/2019 | Lee | G02F 1/133617 |
| 2019/0235311 A1* | 8/2019 | Lee | G02F 1/133617 |
| 2019/0296088 A1* | 9/2019 | Kim | H01L 27/322 |
| 2019/0348470 A1* | 11/2019 | Song | H01L 51/5281 |
| 2020/0258945 A1* | 8/2020 | Joo | H01L 51/5281 |

FOREIGN PATENT DOCUMENTS

| | | |
|---|---|---|
| CN | 107403817 A | 11/2017 |
| CN | 107507845 A | 12/2017 |
| CN | 107544174 A | 1/2018 |
| CN | 107544177 A | 1/2018 |
| CN | 107728368 A | 2/2018 |
| CN | 108153036 A | 6/2018 |
| KR | 10-1039450 B1 | 6/2011 |
| KR | 10-1281877 B1 | 7/2013 |
| KR | 10-2018-0008950 A | 1/2018 |
| KR | 10-2018-0018945 A | 2/2018 |
| KR | 10-2018-0038608 A | 4/2018 |
| KR | 20180038608 A * | 4/2018 |

* cited by examiner

OPTICAL FILTER SUBSTRATE AND DISPLAY DEVICE INCLUDING THE SAME

CROSS-REFERENCE TO RELATED APPLICATION

This application is a continuation application of U.S. patent application Ser. No. 16/555,921 filed on Aug. 29, 2019, which claims priority under 35 USC § 119 to Korean Patent Application No. 10-2018-0129334, filed on Oct. 26, 2018, in the Korean Intellectual Property Office, the disclosures of which are incorporated herein in their entirety by reference.

BACKGROUND

1. Field

One or more embodiments relate to an optical filter substrate and a display device including the optical filter substrate.

2. Description of the Related Art

As various electronic appliances such as mobile phones, personal digital assistants (PDAs), large-sized televisions (TVs), etc. have developed, various kinds of display devices have been developed to be applied to the electronic appliances. For example, display devices widely used in the market may include liquid crystal display (LCD) apparatuses including a backlight unit and organic light-emitting display devices emitting light of different colors from each of pixel areas.

SUMMARY

In addition to the above-described display devices, a quantum dot display device using quantum dots is being developed. One or more embodiments include an optical filter substrate including an element for converting light of a predetermined color to light of a different color and a display device including the optical filter substrate, e.g., a quantum dot display device. However, the above technical feature is exemplary and the scope of the present disclosure is not limited thereto.

Additional aspects will be set forth in part in the description which follows and, in part, will be apparent from the description, or may be learned by practice of the presented embodiments.

According to one or more embodiments, an optical filter substrate includes: a substrate; a first color filter on the substrate; a second color filter on the substrate, the second color filter spaced apart from the first color filter; a first color conversion element on the first color filter, the first color conversion element converting incident light into light of a first color; a second color conversion element on the second color filter, the second color conversion element converting the incident light into light of a second color; and a black matrix located between the first color conversion element and the second color conversion element, and between the first color filter and the second color filter.

The optical filter substrate may further include a first barrier layer arranged between the first color conversion element and the first color filter and between the second color conversion element and the second color filter.

The optical filter substrate may further include: a first coating element on the first color conversion element, the first coating element being hydrophobic; and a second coating element on the second color conversion element, the second coating element being hydrophobic.

The first coating element may be spaced apart from the second coating element.

The optical filter substrate may further include a second barrier layer arranged between the first color conversion element and the first coating element and between the second color conversion element and the second coating element.

Each of the first color conversion element and the second color conversion element may include quantum dots.

The optical filter substrate may further include an overcoat layer that covers the first color conversion element and the second color conversion element.

According to one or more embodiments, a display device includes: a light source substrate emitting light of a color; and an optical filter substrate facing the light source substrate, wherein the optical filter substrate includes: a first color conversion element configured to convert light emitted from the light source substrate into light of a first color; a second color conversion element configured to convert the light emitted from the light source substrate into light of a second color, the second color conversion element being adjacent to the first color conversion element; a first color filter on a path of the light that has passed through the first color conversion element; a second color filter on a path of the light that has passed through the second color conversion element; and a black matrix located between the first color conversion element and the second color conversion element, and between the first color filter and the second color filter.

The display device may further include a first coating element and a second coating element respectively on the first color conversion element and the second color conversion element.

The optical filter substrate may include: a substrate; and a plurality of diodes on the substrate, the plurality of diodes emitting blue light.

The display device may further include a pixel circuit electrically connected to the plurality of diodes, the pixel circuit including a thin film transistor.

Each of the plurality of diodes may include an organic light-emitting diode or an inorganic light-emitting diode.

Each of the plurality of diodes may include a first electrode, a second electrode facing the first electrode, and an emission layer between the first electrode and the second electrode, and the light source substrate may include a pixel defining layer including an opening corresponding to the first electrode, wherein a width of the opening in the pixel defining layer is equal to or greater than a width of one of the first coating element and the second coating element corresponding to the opening.

The display device may further include a first barrier layer arranged between the first color conversion element and the first color filter and between the second color conversion element and the second color filter.

A first surface of the black matrix, the first surface facing the substrate, may be separated from the substrate as the first barrier layer arranged therebetween.

Each of the first color conversion element and the second color conversion element may include a side surface that is tapered in a direction away from the substrate.

Each of the first color conversion element and the second color conversion element may include quantum dots.

The display device may further include a transmission element arranged adjacent to the first color conversion element or the second color conversion element, the transmission element transmitting the light emitted from the light source substrate, wherein at least one of the first color conversion element, the second color conversion element, or the transmission element further may include scattering particles.

A height from the substrate to the black matrix may be greater than a height of the first color conversion element from the substrate or a height of the second color conversion element from the substrate.

The optical filter substrate further may include an overcoat layer that covers the first color conversion element, the second color conversion element, and the black matrix.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
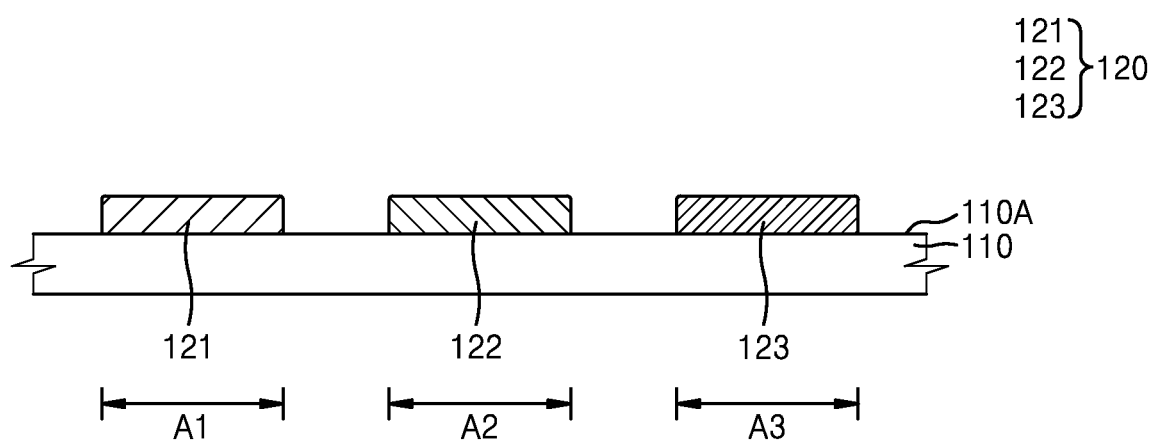
FIGS. 1, 2, 3, 4, 5, 6 and 7 are cross-sectional views showing processes of manufacturing an optical filter substrate according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The example embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the embodiments below, when layers, areas, or elements or the like are referred to as being "connected," it will be understood that they can be directly connected or an intervening portion may be present between layers, areas or elements. For example, when layers, areas, or elements or the like are referred to as being "electrically connected," they can be directly electrically connected, or layers, areas or elements may be indirectly electrically connected and an intervening portion may be present.

FIGS. 1 to 7 are cross-sectional views showing processes of manufacturing an optical filter substrate according to an embodiment.

Referring to FIG. 1, a color filter layer 120 is formed on a substrate 110 (hereinafter, referred to as a first substrate). The color filter layer 120 is arranged on a first surface 110A of the first substrate 110. The color filter layer 120 may include first to third color filters 121, 122 and 123 that are respectively located in a first region A1, a second region A2, and a third region A3. The first to third regions A1, A2, and A3 may denote partial regions of the first substrate 110. That is, it may be understood that the first substrate 110 includes the first to third regions A1, A2, and A3. The first to third regions A1, A2, and A3 are spaced apart from one another and thus the first to third color filters 121, 122, and 123 may be spaced apart from one another.

The first substrate 110 may include a transparent glass material or a transparent resin material. As an embodiment, the first substrate 110 may be a transparent glass substrate mainly including $SiO_2$. As another embodiment, the first substrate 110 may include a polymer resin. The transparent polymer resin may include a polyether sulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), cellulose acetate propionate (CAP), etc., and the polymer resin may be transparent. The first substrate 110 may have a single-layered or multi-layered structure including the polymer resin. As an embodiment, the first substrate 110 having the multi-layered structure may include a layer that includes the polymer resin and an additional layer that includes an inorganic insulating layer, an adhesive layer, etc.

The first to third color filters 121, 122, and 123 may be respectively patterned in the first to third regions A1, A2, and A3 of the first substrate 110.

For example, a first photosensitive color layer including a pigment or a dye of a first color (e.g., red) is formed on the first substrate 110 and then patterned to obtain the first color filter 121 in the first region A1. After that, a second photosensitive color layer (not shown) including a pigment or a dye of a second color (e.g., green) is formed on the first substrate 110 and then patterned to obtain the second color filter 122 in the second region A2. In addition, a third photosensitive color layer (not shown) including a pigment or a dye of a third color (e.g., blue) is formed on the first substrate 110 and then patterned to obtain the third color filter 123 in the third region A3.

Figure 2:
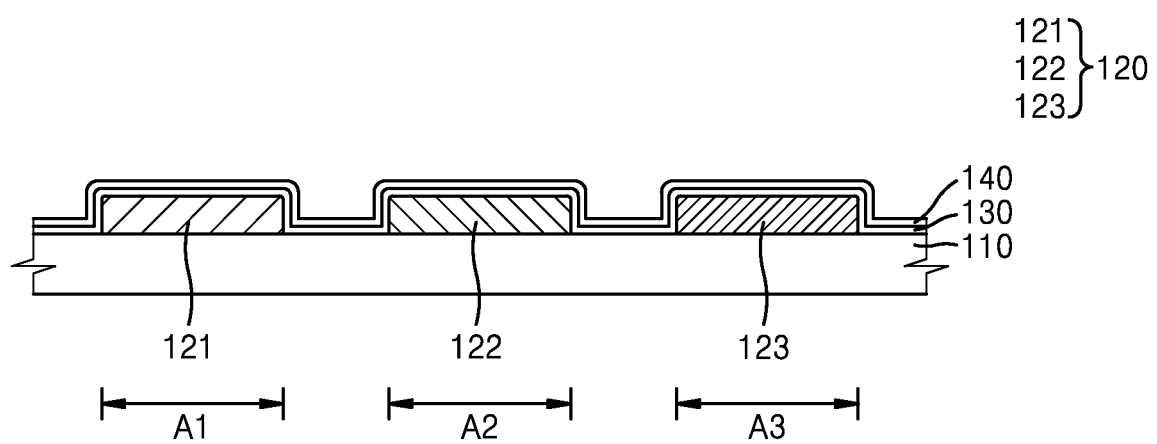

Referring to FIG. 2, a first barrier layer 130 is formed on the first substrate 110, on which the first to third color filters 121, 122, and 123 are arranged. The first barrier layer 130 may prevent outgassing from the first to third color filters 121, 122, and 123. The first barrier layer 130 may include an inorganic material. For example, the first barrier layer 130 may include an inorganic insulating material such as silicon nitride ($SiN_x$), silicon oxynitride (SiON), and/or silicon oxide ($SiO_x$). Alternatively, the first barrier layer 130 may include an organic insulating material, or an inorganic insulating material and an organic insulating material.

After that, a first refractive index layer 140 may be formed on the first barrier layer 130. The first refractive index layer 140 is a layer having a first refractive index and may improve a light-emitting efficiency of light passing through a color-converting transmission layer 150 (see FIG. 3) that will be described later. The first refractive index may be less than a refractive index of each of first and second color conversion elements 151 and 152 and a transmission element 153 in the color-converting transmission layer 150 that will be arranged in a next process that will be described later. Therefore, total reflection in a display device may be induced and thus light-emitting efficiency may be improved. In this regard, details will be described later.

The first refractive index layer 140 may include an inorganic material or an organic material. The first refractive index of the first refractive index layer 140 may be less than about 1.4. For example, the first refractive index of the first refractive index layer may be about 1.2 or less. A refractive index of each of the first and second color conversion elements 151 and 152 and the transmission element 153 of the color-converting transmission layer 150 (see FIG. 3) may be about 1.4 or greater, e.g., a range of 1.4 to 1.7. In some embodiments, the first refractive index layer 140 may be omitted.

Figure 3:
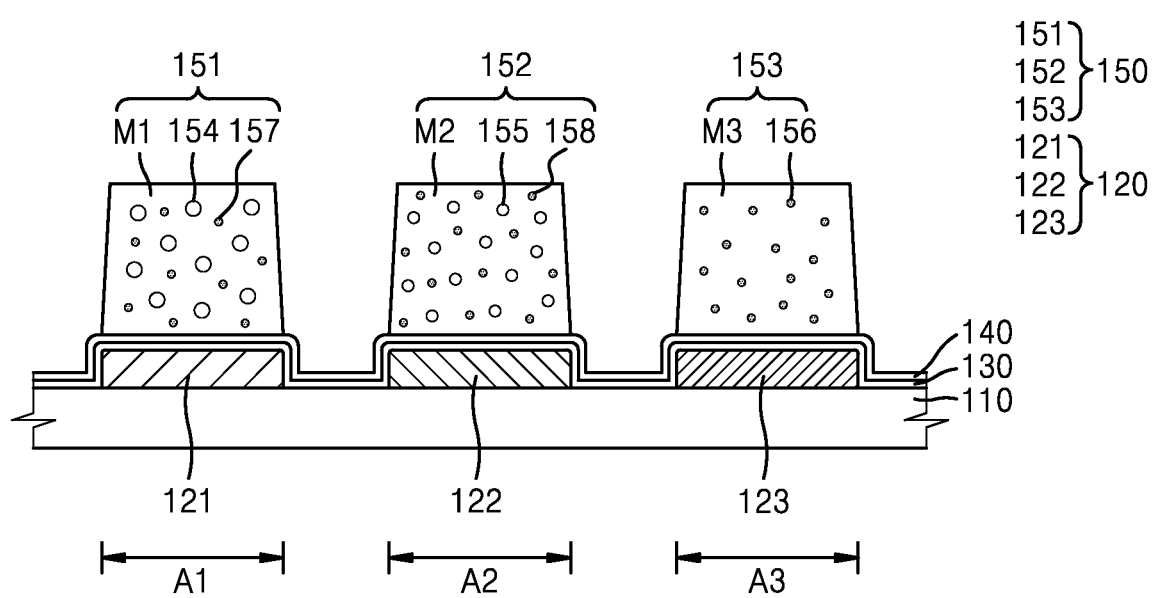

Referring to FIG. 3, the color-converting transmission layer 150 is formed on the first barrier layer 130 and/or the first refractive index layer 140. The color-converting transmission layer 150 may include the first color conversion element 151 in the first region A1, the second color conversion element 152 in the second region A2, and the transmission element 153 in the third region A3. The first color conversion element 151, the second color conversion element 152, and the transmission element 153 may be spaced apart from one another.

The first color conversion element 151 may overlap the first color filter 121, the second color conversion element 152 may overlap the second color filter 122, and the transmission element 153 may overlap the third color filter 123. Therefore, a gap between the first and second color filters 121 and 122 may be spatially connected to a gap between the first and second color conversion elements 151 and 152. Likewise, a gap between the second and third color filters 122 and 123 may be spatially connected to a gap between the second color conversion element 152 and the transmission element 153. Although not shown in FIG. 3, a gap between the third and first color filters 123 and 121 may be spatially connected to a gap between the transmission element 153 and the first color conversion element 151.

The first color conversion element 151, the second color conversion element 152, and the transmission element 153 may be individually formed.

The first color conversion element 151 may include a photosensitive material M1 and quantum dots 154 that convert incident light that is incident to the first color conversion element 151 into light of a first color (e.g., red light). The photosensitive material M1 may include resin, for example an acrylic based material. The first color conversion element 151 may be obtained by arranging a layer including the photosensitive material M1 and the quantum dots 154 and then exposing and developing the layer.

Each of the quantum dots 154 included in the first color conversion element 151 may convert the incident light (e.g., blue light) that is incident to the first color conversion element 151 into red light. As an embodiment, the red light may have a peak wavelength within a range from about 620 nm to about 750 nm.

The second color conversion element 152 may include a photosensitive material M2 and quantum dots 155 that convert incident light that is incident to the second color conversion element 152 into light of a second color (e.g., green light). The photosensitive material M2 may include resin, for example an acrylic based material. The second color conversion element 152 may be obtained by arranging a layer including the photosensitive material M2 and the quantum dots 155 and then exposing and developing the layer.

Each of the quantum dots 155 included in the second color conversion element 152 may convert the incident light (e.g., blue light) that is incident to the second color conversion element 152 into green light. As an embodiment, the green light may have a peak wavelength within a range from about 490 nm to about 570 nm.

Each of the quantum dots 154 and 155 respectively included in the first and second color conversion elements 151 and 152 may have a color structure or a core-shell structure. As an embodiment, the quantum dots 154 and 155 may each include a core including one selected from CdS, CdSe, CdTe, ZnS, ZnSe, InAs, ZnSe, ZnO, ZnTe, InP, GaP, InGaN, and InN. As another embodiment, the quantum dots 154 and 155 may each include the core and a shell surrounding the core. The shell may include any one selected from ZnS, ZnSe, GaP, and GaN.

The quantum dot 154 in the first color conversion element 151 may have a size that is different from that of the quantum dot 155 in the second color conversion element 152. Since the quantum dot emits light of a relatively shorter wavelength as the size thereof is reduced, the quantum dot 155 in the second color conversion element 152 may have a smaller size than that of the quantum dot 154 in the first color conversion element 151.

The transmission element 153 may include a photosensitive material M3 that transmits incident light. For example, the light that has passed through the transmission element 153 may have the same color as that of the incident light (e.g., blue light) to the transmission element 153.

The transmission element 153 may be obtained by forming a layer including the photosensitive material M3 and then exposing and developing the layer. The photosensitive material M3 may include resin, for example an acrylic based material.

The transmission element 153 may include scattering particles 156 dispersed in the photosensitive material M3. For example, the transmission element 153 may include the scattering particles 156 such as titanium oxide ($TiO_2$).

As an embodiment, the first color conversion element 151, the second color conversion element 152, and/or the transmission element 153 may respectively have a thickness greater than those of the first to third color filters 121, 122, and 123. As an embodiment, the first color conversion element 151, the second color conversion element 152, and/or the transmission element 153 may each have a thickness of about 4 μm to about 10 μm, for example, about 6 μm to about 8 μm.

The first color conversion element 151, the second color conversion element 152, and/or the transmission element 153 may each have a trapezoidal shape having a width that is reduced in a direction away from the first substrate 110, as shown in FIG. 3. Side surfaces of the first color conversion element 151, the second color conversion element 152, and/or the transmission element 153 may be tapered in a direction away from the first substrate 110.

At least one of the first or second color conversion elements 151 and 152 may further include scattering particles 157 and 158 such as titanium oxide, in addition to the quantum dots 154 and 155.

Figure 4:
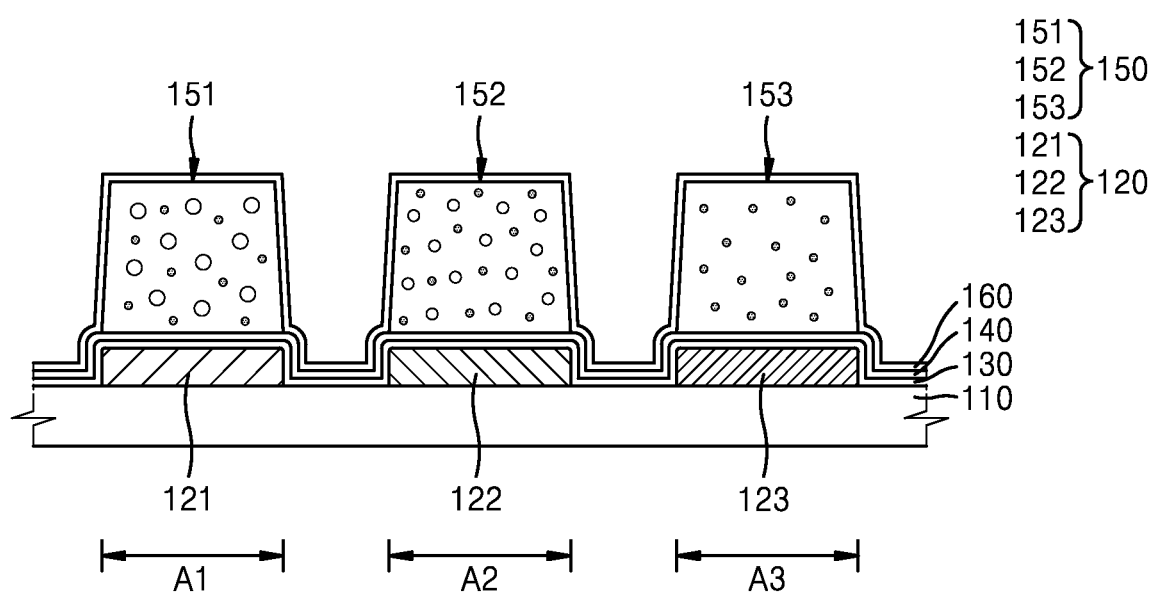

Referring to FIG. 4, a second barrier layer 160 is formed on the color-converting transmission layer 150. The second barrier layer 160 may prevent outgassing from the first color conversion element 151, the second color conversion element 152, and the transmission element 153. The second barrier layer 160 may include an inorganic material. For example, the second barrier layer 160 may include an inorganic insulating material such as silicon nitride ($SiN_x$), silicon oxynitride (SiON), and/or silicon oxide ($SiO_x$). Otherwise, the second barrier layer 160 may include an organic insulating material.

The second barrier layer 160 may be arranged entirely on the first substrate 110 to cover the color-converting transmission layer 150. The second barrier layer 160 may be in contact with the first refractive index layer 140 disposed between two adjacent regions from among the first to third regions A1, A2, and A3. Regarding this, FIG. 4 shows that the second barrier layer 160 contacts the first refractive index layer 140 disposed between the first and second regions A1 and A2 and disposed between the second and third regions A2 and A3. As another embodiment, when the first refractive index layer 140 is omitted, the second barrier layer 160 may directly contact the first barrier layer 130 disposed between the first and second regions A1 and A2.

Figure 5:
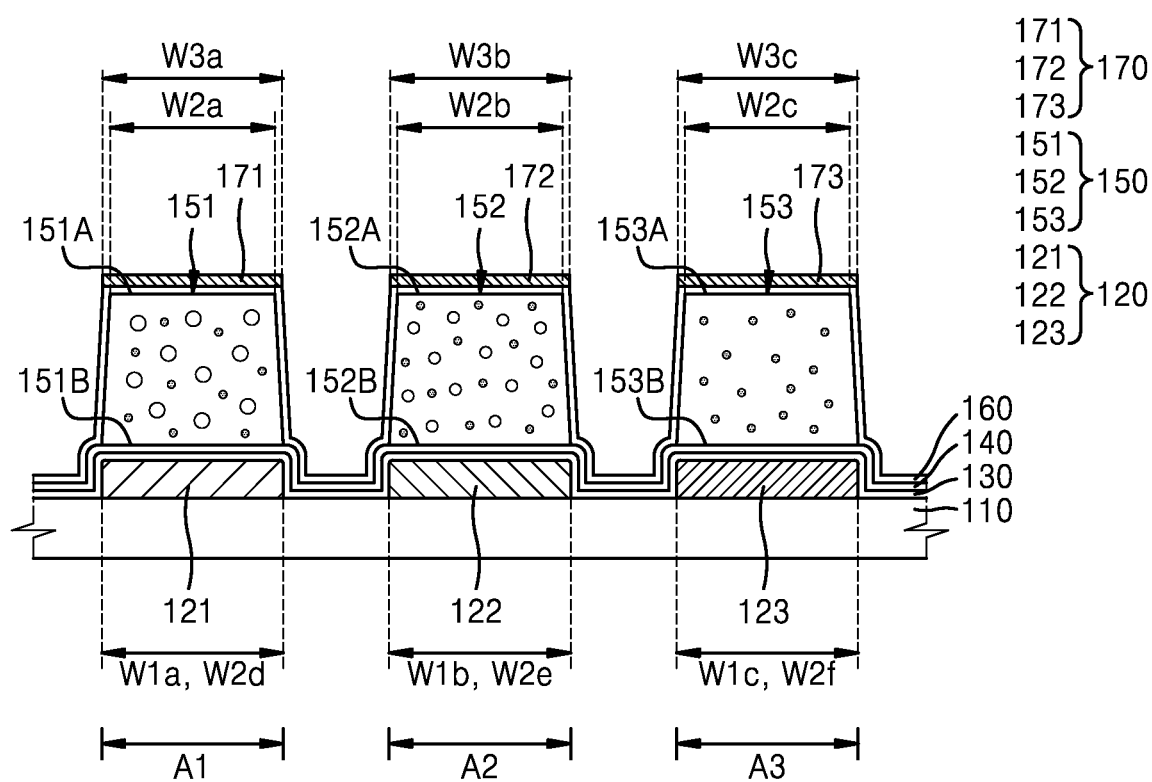

Referring to FIG. 5, a hydrophobic coating layer 170 is formed on the second barrier layer 160. The hydrophobic coating layer 170 may include a first coating element 171 located in the first region A1, a second coating element 172 located in the second region A2, and a third coating element 173 located in the third region A3. Each of the first to third coating elements 171, 172, and 173 may include a hydrophobic material, e.g., fluorine-based material.

The first to third coating elements 171, 172, and 173 may be patterned to respectively correspond to the first to third regions A1, A2, and A3. The first to third coating elements 171, 172, and 173 may be spaced apart from one another.

A width W3a of the first coating element 171 may be equal to or greater than a width W2a of a first surface 151A of the first color conversion element 151. A width W3b of the second coating element 172 may be equal to or greater than a width W2b of a first surface 152A of the second color conversion element 152. Similarly, a width W3c of the third coating element 173 may be equal to or greater than a width W2c of a first surface 153A of the transmission element 153. Here, the first surface 151A of the first color conversion element 151 is opposite to a second surface 151B of the first color conversion element 151, wherein the second surface 151B faces the first substrate 110. The first surface 152A of the second color conversion element 152 is opposite to a second surface 152B of the second color conversion element 152, wherein the second surface 152B faces the first substrate 110, and the first surface 153A of the transmission element 153 is opposite to a second surface 153B of the transmission element 153, wherein the second surface 153B faces the first substrate 110.

A width W2d of the second surface 151B of the first color conversion element 151 may be equal to or less than a width W1a of the first color filter 121. Regarding this, FIG. 5 shows that the width W2d of the second surface 151B of the first color conversion element 151 is equal to the width W1a of the first color filter 121. As described later with reference to FIG. 8, a color purity of the light that has passed through the first color conversion element 151 may be improved while the light passes through the first color filter 121. As a comparative example, when the width W2d of the second surface 151B in the first color conversion element 151 is greater than the width W1a of the first color filter 121 and the first color conversion element 151 does not partially overlap the first color filter 121, some of the light that has passed through the first color conversion element 151 is emitted to the outside through the first substrate 110 without passing through the first color filter 121, and accordingly the color purity of the light (e.g., red light) of the first color emitted from the first region A1 may degrade.

Similarly, a width W2e of the second surface 152B of the second color conversion element 152 may be equal to or less than a width W1b of the second color filter 122. A width W2f of the second surface 153B of the transmission element 153 may be equal to or less than a width W1c of the third color filter 123. Regarding this, FIG. 5 shows that the width W2e of the second surface 152B of the second color conversion element 152 is equal to the width W1b of the second color filter 122 and the width W2f of the second surface 153B of the transmission element 153 is equal to the width W1c of the third color filter 123.

Figure 6:
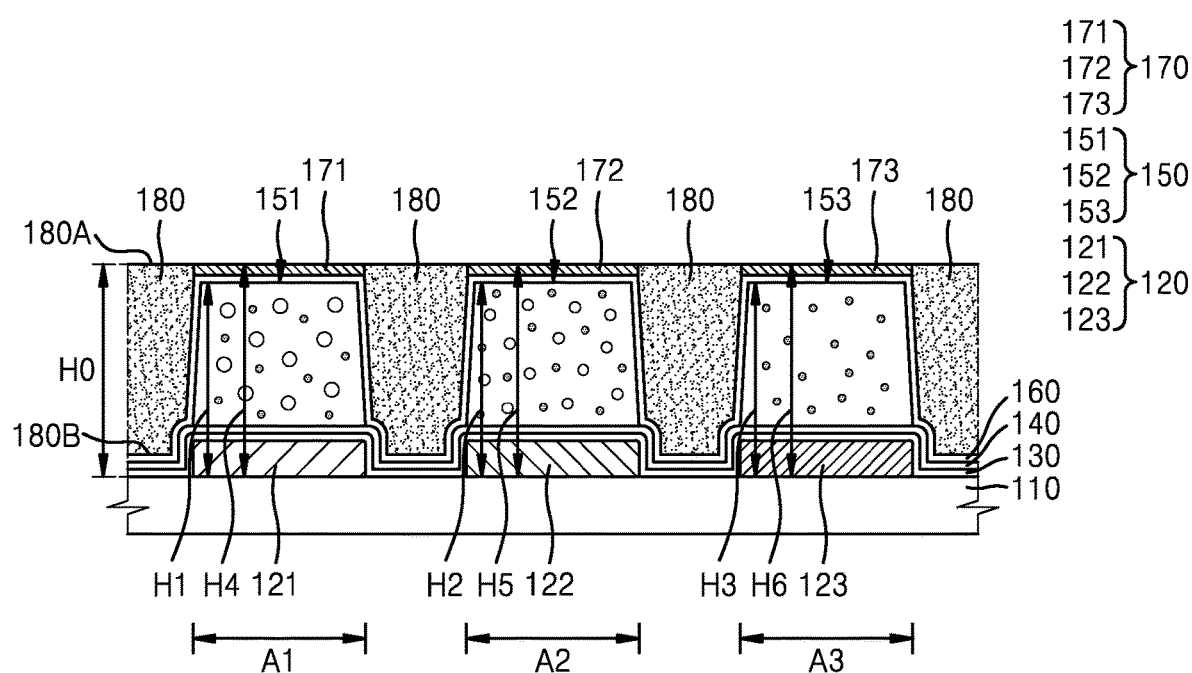

Referring to FIG. 6, a black matrix 180 is formed. The black matrix 180 is arranged between two adjacent regions from among the first to third regions A1, A2, and A3. The black matrix 180 may be formed by an inkjet method. Since the black matrix 180 is formed by the inkjet method, there is no need to perform an additional mask process and/or photolithography process. Thus, manufacturing processes may be simplified and manufacturing costs may be reduced.

Because a thickness of the color filter layer 120 is greater than a total thickness of the first barrier layer 130, the refractive index layer 140 and the second barrier layer, the gap (hereinafter, referred to as a first gap) between two neighboring color filters in the color filter layer 120 is spatially connected to the gap (hereinafter, referred to as a second gap) between two neighboring elements in the color-converting transmission layer 150. Thus a material for forming the black matrix 180 may be simultaneously filled in both the first and second gaps. The black matrix 180 may overlap side surfaces of the neighboring elements in the color-converting transmission layer 150. For example, side surfaces of each of the first color conversion element 151, the second color conversion element 152, and the transmission element 153 may be entirely covered by side surfaces of the black matrix 180. The side surfaces of the black matrix 180 may simultaneously cover the side surfaces of the elements in the color-converting transmission layer 150 and the side surfaces of the color filters in the color filter layer 120. A second surface 180B of the black matrix 180 may directly contact the second barrier layer 160. That is, the second surface 180B of the black matrix 180 may be separated a predetermined distance from a first surface 110A of the first substrate 110, and the first and second barrier layers 130 and 160 and the first refractive index layer 140 may be arranged between the second surface 180B of the black matrix 180 and the first surface 110A of the first substrate 110.

The light that has passed through each of the first color conversion element 151, the second color conversion element 152, and the transmission element 153 may proceed in all directions. For example, the light of the first color (e.g., red light) emitted from the first color conversion element 151 may proceed towards the second color conversion element 152 or the transmission element 153. In this case, the black matrix 180 may block the light proceeding towards the second color conversion element 152 or the transmission element 153. Likewise, the black matrix 180 may block the light of the second color (e.g., green light) that is emitted from the second color conversion element 152 from proceeding towards the first color conversion element 151 or the transmission element 153. Also, the black matrix 180 may block the light of third color that is emitted from the transmission element 153 from proceeding towards the second color conversion element 152 or the first color conversion element 151 adjacent to the transmission element 153.

The first to third coating elements 171, 172, and 173 having the hydrophobic property may control a flow of the material included in the black matrix 180 during the forming process of the black matrix 180. For example, the material included in the black matrix 180 may not formed over the first to third coating elements 171, 172, and 173. A location and/or a width of the first surface 180A of the black matrix 180 may be controlled by the first to third coating elements 171, 172, and 173. A height of the black matrix 180, e.g., a height H0 from the first substrate 110 to the first surface 180A of the black matrix 180, may be determined according to heights of surfaces of the first to third coating elements 171, 172, and 173. For example, the first surface 180A of the black matrix 180 may be disposed on a same plane as each of the first to third coating elements 171, 172, and 173.

The height H0 from the first substrate 110 to the black matrix 180 may be greater than a height H1, H2, or H3 from the first substrate 110 to each of the elements in the color-converting transmission layer 150. The height H0 of the black matrix 180 from the first substrate 110, that is, the height H0 of the first surface 180A of the black matrix 180 from the first substrate 110, may be substantially the same as a height H4, H5, or H6 of each of the coating elements in the hydrophobic coating layer 170 from the first substrate 110.

Here, the height H0 of the black matrix 180 from the first substrate 110 being substantially equal to the height of each coating elements in the hydrophobic coating layer 170 from the first substrate 110 may denote that the height H0 of the black matrix 180 is different from a height H4, H5, or H6 of one of the first to third coating elements 171, 172, and 173 from the first substrate 110 by ±15% or less, e.g., ±10% or less.

A width of the black matrix 180 may be dependent upon elements of the color-converting transmission layer 150. For example, as described above with reference to FIG. 3, when the first color conversion element 151, the second color conversion element 152, and the transmission element 153 each have a trapezoidal cross-section having a width that is decreased in a direction away from the first substrate 110, at least a portion of the black matrix 180 may have a reversed trapezoidal cross-section having a width increased in a direction away from the first substrate 110.

Figure 7:
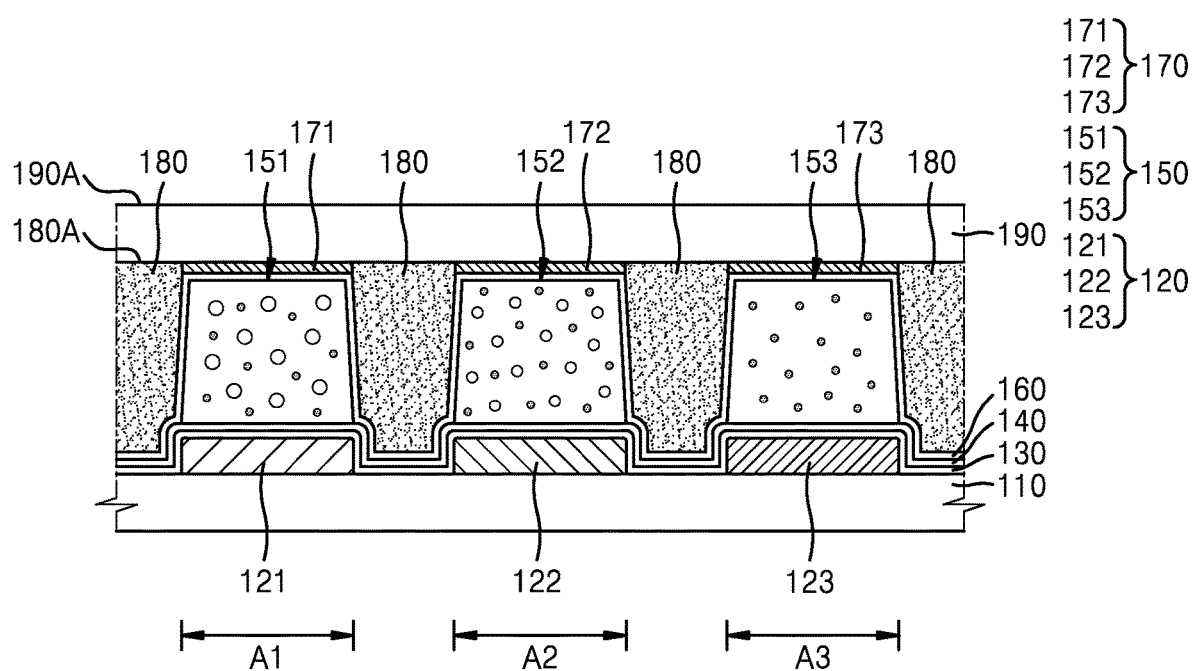

Referring to FIG. 7, an overcoat layer 190 is formed over the first substrate 110. The overcoat layer 190 is entirely formed to cover elements or layers on the first substrate 110. The overcoat layer 190 may include an organic material such as a resin, and the organic material may be transparent. The overcoat layer 190 may cover steps (or irregularity) that may occur between the first surface 180A of the black matrix 180 and first to third coating elements 171, 172, and 173. A first surface 190A of the overcoat layer 190 may substantially be flat. As an embodiment, the overcoat layer 190 may have a thickness of about 1 μm to about 4 μm.

Figure 8:
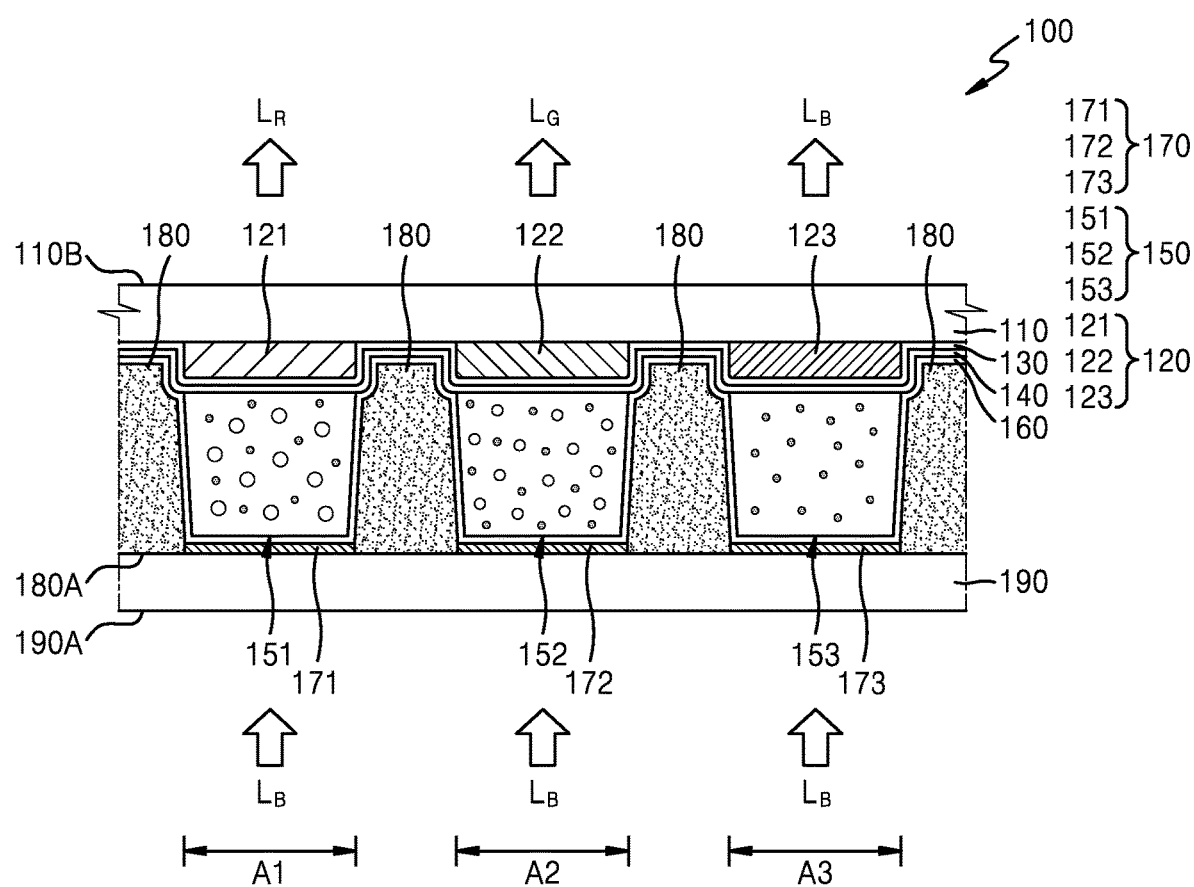
FIG. 8 is a cross-sectional view of an optical filter substrate according to an embodiment.

FIG. 8 is a cross-sectional view illustrating a concept of an optical filter substrate 100 according to an embodiment.

Referring to FIG. 8, the first surface 190A of the overcoat layer 190 corresponds to an incident surface through which the light is incident to the optical filter substrate 100, and the second surface 110B of the first substrate 110 may correspond to an exit surface of the light emitted from the optical filter substrate 100.

Blue light incident to the optical filter substrate 100 may be converted into red light while passing through the first color conversion element 151 arranged in the first region A1. For example, quantum dots of the first color conversion element 151 absorbs the blue light, that is, the incident light, and then may emit red light of a first wavelength band that is longer than the wavelength of the incident light. The blue light that is incident to the first color conversion element 151 and is not converted by the quantum dots is emitted to the outside, color purity of the light emitted from the first region A1 may degrade. However, according to the embodiment, the first color filter 121 that transmits the light of the first wavelength band (e.g., wavelength band of red light) is arranged to overlap the first color conversion element 151, and, as described above, the black matrix 180 is interposed between the first color filter 121 and a neighboring color filter (e.g., the second color filter 122) and between the first color conversion element 151 and a neighboring element (e.g., the second color conversion element 152), thus the light having a wavelength band other than the first wavelength band may be prevented from emitting to the outside after passing through the optical filter substrate 100.

Similarly, blue light incident to the optical filter substrate 100 may be converted into green light while passing through the second color conversion element 152 arranged in the second region A2. Quantum dots of the second color conversion element 152 absorb the blue light, that is, the incident light and may emit the green light of a second wavelength band that is longer than the wavelength of the incident light. Since the second color filter 122 that transmits light of the second wavelength band (e.g., wavelength band of green light) is arranged to overlap the second color conversion element 152 and the black matrix 180 is arranged to surround the second color conversion element 152, the light having a wavelength band other than the second wavelength band may prevented from emitting to the outside after passing through the optical filter substrate 100 may be prevented.

The blue light incident to the transmission element 153 may be emitted to outside after passing through the transmission element 153. An optical efficiency of the blue light passing through the transmission element 153 may be improved by scattering particles included in the transmission element 153.

The third color filter 123 is arranged overlapping the transmission element 153, and the blue light that has passed through the transmission element 153 may be emitted to the outside after passing through the third color filter 123. The blue light that has passed through the transmission element 153 transmits through the third color filter 123 that transmits the light of a third wavelength band (e.g., wavelength band of the blue light) and the black matrix 180 surrounds the third color filter 123 and the transmission element 153, and thus color purity of the blue light emitted from the third region A3 of the optical filter substrate 100 may be improved.

The blue light may be incident towards the optical filter substrate 100 in the first to third regions A1, A2, and A3, and the light that has passed through the optical filter substrate 100 may have various colors. For example, the first region A1 may emit the red light, the second region A2 may emit the green light, and the third region A3 may emit the blue light. Thus, the first to third regions A1, A2, and A3 may be understood as red, green, and blue pixel areas, respectively.

The optical filter substrate 100 illustrated in FIG. 8 may be manufactured by the processes described above with reference to FIGS. 1 to 7. In the optical filter substrate 100, a region that is not covered by the black matrix 180 may correspond to a region, from which the light is emitted, that is, a light emitting region. An area of the light emitting region that emits the light in the optical filter substrate 100 may be dependent upon the black matrix 180. Since the black matrix 180 is controlled by the first to third coating elements 171, 172, and 173, an aperture ratio of the optical filter substrate 100 may be dependent upon the first to third coating elements 171, 172, and 173.

Figure 9:
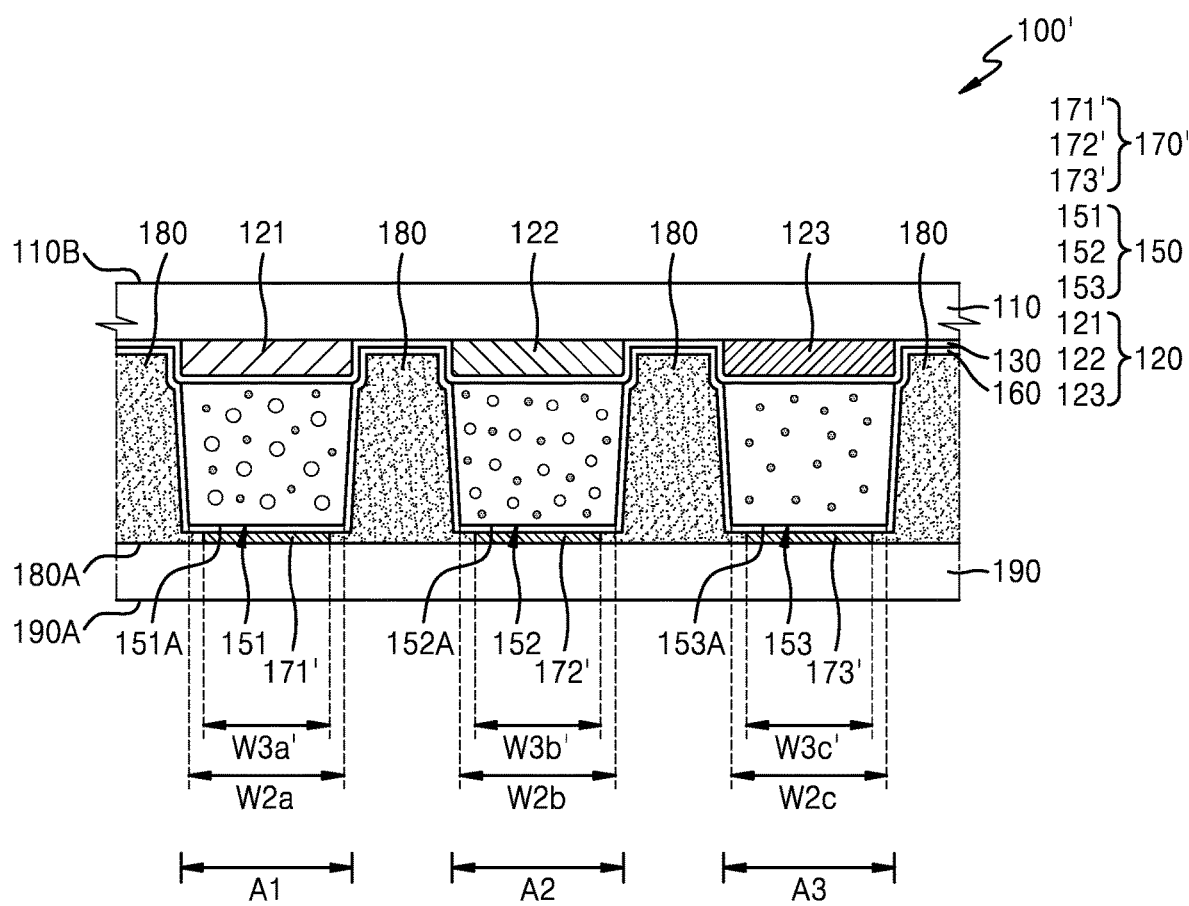
FIG. 9 is a cross-sectional view of an optical filter substrate according to another embodiment.

FIG. 9 is a cross-sectional view of an optical filter substrate 100' according to another embodiment. The optical filter substrate 100' of FIG. 9 is different from the optical filter substrate 100 described above with reference to FIGS. 1 to 8 in view of coating elements in a hydrophobic coating layer 170' and the difference will be described below. In the optical filter substrate 100' of FIG. 9, a first refractive index layer is omitted unlike in the optical filter substrate 100 of FIG. 8, but as another embodiment, the first refractive index layer 140 may be arranged on the first barrier layer 130.

Referring to FIG. 9, widths of first to third coating elements 171', 172', and 173' may be less than those of elements in the color-converting transmission layer 150. A width W3a' of the first coating element 171' may be less than the width W2a of the first surface 151A of the first color conversion element 151. A width W3b' of the second coating element 172' may be less than the width W2b of the first surface 152A of the second color conversion element 152. A width W3c' of the third coating element 173' may be less than the width W2c of the first surface 153A of the transmission element 153.

The black matrix 180 is located between neighboring coating elements among the first to third coating elements 171', 172', and 173'. Since the width of the black matrix 180 may be adjusted by the first to third coating elements 171', 172', and 173', ends of the black matrix 180 may overlap edges of the first and second color conversion elements 151 and 152 and the transmission element 153, respectively.

Figure 10:
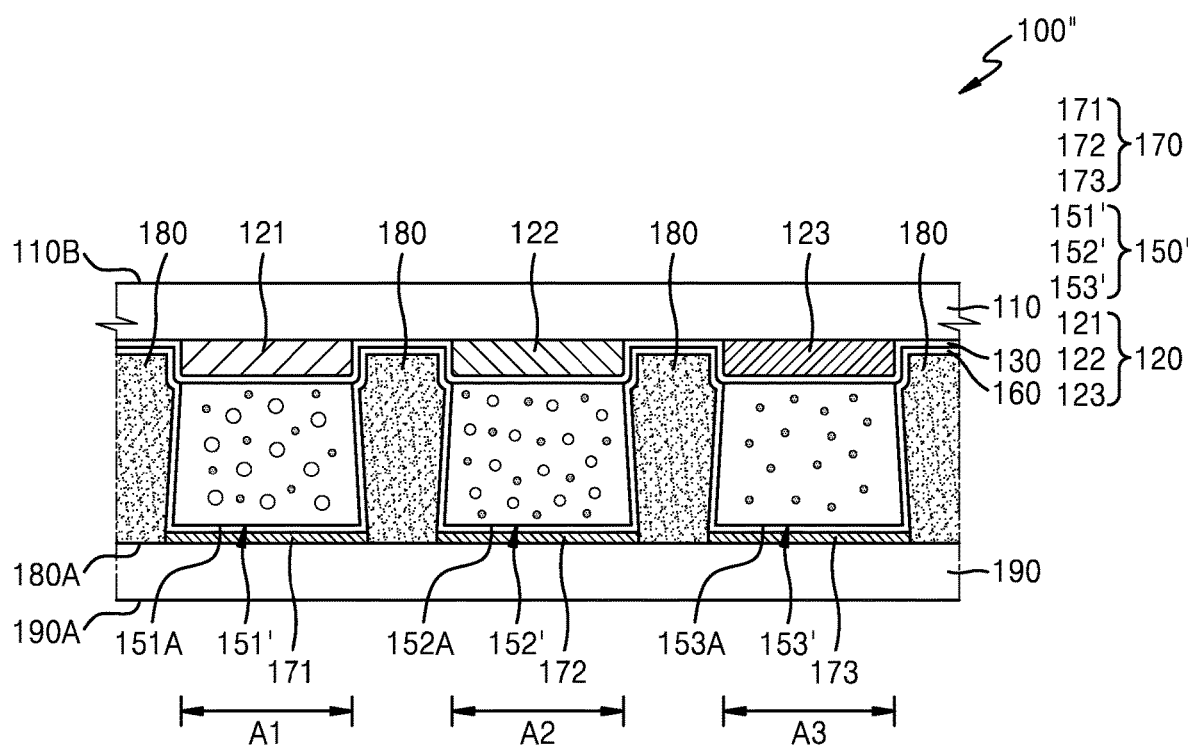
FIG. 10 is a cross-sectional view of an optical filter substrate according to another embodiment.

FIG. 10 is a cross-sectional view of an optical filter substrate 100" according to another embodiment. The optical filter substrate 100" of FIG. 10 is different from the optical filter substrate 100 described above with reference to FIGS. 1 to 8 in elements of a color-converting transmission layer 150' and the difference will be described below. In the optical filter substrate 100" of FIG. 10, a first refractive index layer is omitted unlike in the optical filter substrate 100 of FIG. 8, but as another embodiment, the first refractive index layer 140 may be arranged on the first barrier layer 130.

Referring to FIG. 10, the elements of the color-converting transmission layer 150' may each have a cross-section having an increased width in a direction away from the first substrate 110 according to a kind of a photosensitive material included in each of the elements.

A first color conversion element 151' may have a side surface that is tapered in a direction away from the first substrate 110, e.g., in a direction opposite to a tapered direction of the side surface in the first color conversion element 151 shown in FIG. 8. A second color conversion element 152' may also have a side surface that is tapered in a direction away from the first substrate 110, and a transmission element 153' may also have a side surface tapered in a direction away from the first substrate 110. In the black matrix 180, a portion corresponding to the side surface of each element in the color-converting transmission layer 150' may have a cross-section having a reduced width in a direction away from the first substrate 110.

Figure 11:
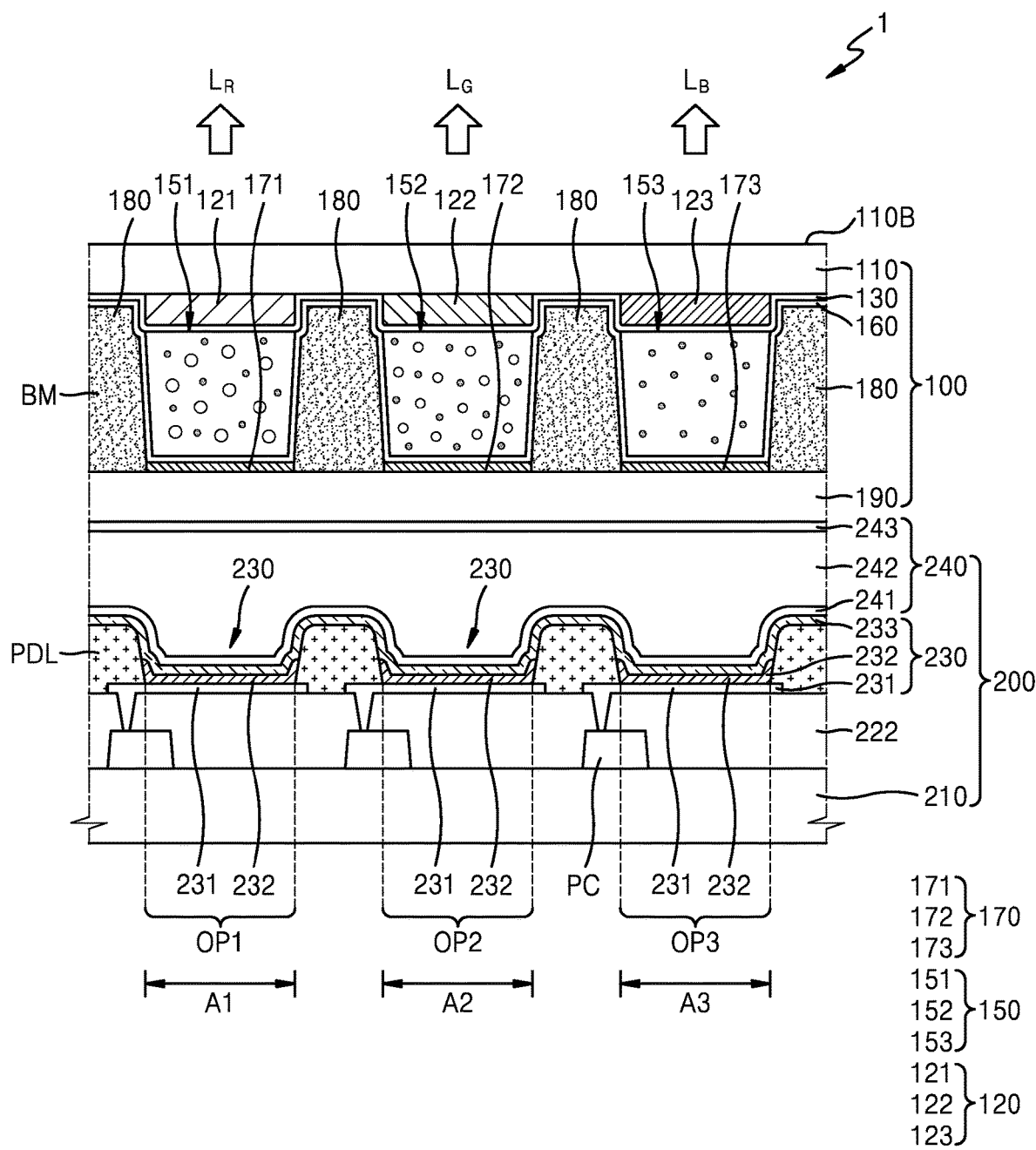
FIG. 11 is a cross-sectional view of a display device according to an embodiment.
Figure 12:
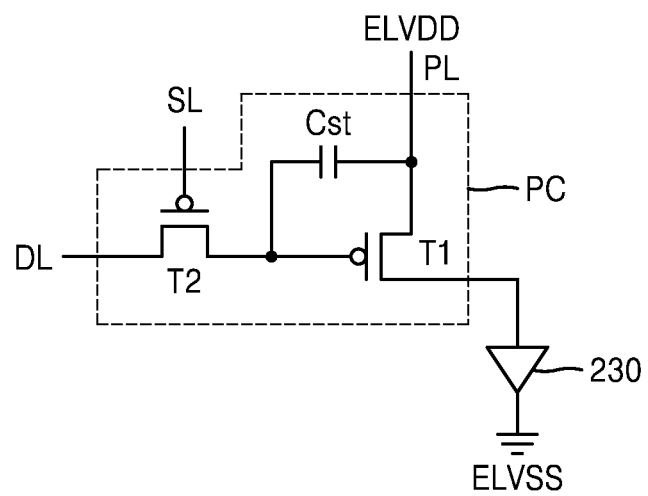
FIG. 12 is an equivalent circuit diagram of a pixel circuit of FIG. 11.

FIG. 11 is a cross-sectional view of a display device 1 according to an embodiment, and FIG. 12 is an equivalent circuit diagram of a pixel circuit of FIG. 11.

Referring to FIG. 11, the display device 1 may include the optical filter substrate 100 and a light source substrate 200 facing the optical filter substrate 100. FIG. 11 shows the optical filter substrate 100 described above with reference to FIG. 8, but is not limited thereto. As another embodiment, the display device 1 may include the optical filter substrate according to one of the embodiments illustrated in FIGS. 8 to 10, or another optical filter substrate modified therefrom. Characteristics of the optical filter substrate 100 are described above and thus the light source substrate 200 will be described below.

The light source substrate 200 is a self-emissive substrate and may include a diode 230. The light source substrate 200 may include a pixel circuit PC arranged on a substrate 210 (hereinafter, referred to as a second substrate) and the diode 230 electrically connected to the pixel circuit PC. The pixel circuit PC and the diode 230 may be arranged in each pixel area, e.g., each of the first to third regions A1, A2, and A3.

The second substrate 210 may include a glass material or a resin material. As shown in FIG. 12, the pixel circuit PC may include first and second thin film transistors T1 and T2, a storage capacitor Cst, and wirings electrically connected the first and second thin film transistors T1 and T2 and the storage capacitor Cst. Referring to FIG. 12, the second thin film transistor T2 is a switching thin film transistor and is connected to a scan line SL and a data line DL, and may transfer a data voltage input from the data line DL to the first thin film transistor T1 according to a switching voltage input from the scan line SL. The storage capacitor Cst is connected to the second thin film transistor T2 and a driving voltage line PL and may store a voltage corresponding to a difference between a voltage transferred from the second thin film transistor T2 and a first power voltage ELVDD supplied to the driving voltage line PL.

The first thin film transistor T1 is a driving thin film transistor connected between the driving voltage line PL and an anode of the diode 230. The storage capacitor Cst is connected between the driving voltage line PL and a control electrode of the first thin film transistor T1. The first thin film transistor T1 may control a driving current flowing in the diode 230 from the driving voltage line PL corresponding to the voltage value stored in the storage capacitor Cst. The diode 230 may emit light of a predetermined luminance according to the driving current. A second electrode (e.g., cathode) of the diode 230 may receive a second power voltage ELVSS. FIG. 12 illustrates that the pixel circuit PC includes two thin film transistors and one storage capacitor, but one or more embodiments are not limited thereto. The number of thin film transistors and the number of the storage capacitor may vary depending on a design of the pixel circuit PC.

Referring back to FIG. 11, the pixel circuit PC may be covered by an insulating layer 222. A first electrode 231 of the diode 230 may be connected to the pixel circuit PC via a contact hole formed in the insulating layer 222.

The diode 230 may be an organic light-emitting diode (OLED). The diode 230 may include the first electrode 231, an emission layer 232, and a second electrode 233.

The first electrode 231 may be an island shaped electrode arranged in each of the first to third regions A1, A2, and A3. The first electrode 231 is a reflective electrode and may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. As another embodiment, the first electrode 231 may further include a conductive oxide layer above/under the reflective layer, wherein the conductive oxide layer may include indium tin oxide (ITO), indium zinc oxide (IZO), zinc oxide (ZnO), indium oxide ($In_2O_3$), indium gallium oxide (IGO), etc.

A pixel defining layer PDL covering edges of the first electrode 231 may be arranged on the first electrode 231. The pixel defining layer PDL includes first to third openings OP1, OP2, and OP3 corresponding respectively to the first to third regions A1, A2, and A3. The first to third openings OP1, OP2, and OP3 correspond to a plurality of first electrodes 231 arranged thereunder, and a center of each of the first electrodes 231 may be exposed through a corresponding opening.

The pixel defining layer PDL may include an organic insulating material, for example, polyimide, hexamethyl disiloxane (HMDSO), etc. Alternatively, the pixel defining layer PDL may include an inorganic insulating material. Alternatively, the pixel defining layer PDL may include inorganic and organic insulating materials.

The emission layer 232 may be an organic emission layer. The emission layer 232 may emit blue light. The emission layer 232 may be arranged in each pixel area, and each pixel area may emit blue light. As another embodiment, the emission layer 232 may be integrally arranged to correspond to the plurality of pixel areas. In this case, the emission layer 232 may cover an upper surface of the pixel defining layer PDL that is located between two neighboring pixel areas.

The emission layer 232 may include a low-molecular weight organic material or a polymer material. Although not shown in the drawings, functional layer(s) may be further arranged above and/or below the emission layer 232. For example, a hole injection layer (HIL) and/or a hole transport layer (HTL) may be further arranged under the emission layer 232. An electron transport layer (ETL) and/or an electron injection layer (EIL) may be arranged above the emission layer 232.

The second electrode 233 may be integrally provided to cover a plurality of emission layers 232. The second electrode 232 is a transmissive electrode including a conductive material having a low work function. For example, the second electrode 233 may include a (semi-) transparent layer including Ag, Mg, Al, Pt, Pd, Au, Ni, Nd, Ir, Cr, lithium (Li), calcium (Ca), or an alloy thereof. Alternatively, the second electrode 233 may further include a layer including ITO, IZO, ZnO, or $In_2O_3$ on the (semi-)transparent layer including the above material.

The diode 230 may be covered by an encapsulation layer 240. The encapsulation layer 240 may include at least one inorganic encapsulation layer and at least one organic encapsulation layer. FIG. 11 shows that the encapsulation layer 240 includes first and second inorganic encapsulation layers 241 and 243 and an organic encapsulation layer 242 arranged between the first and second inorganic encapsulation layers 241 and 243.

The first and second inorganic encapsulation layers 241 and 243 may include one or more inorganic insulating materials from aluminum oxide, titanium oxide, tantalum oxide, hafnium oxide, zinc oxide, silicon oxide, silicon nitride, and silicon oxynitride, and the organic encapsulation layer 242 may include a polymer-based material. The polymer-based material may include an acryl-based resin, an epoxy-based resin, polyimide, polyethylene, etc.

The encapsulation layer 240 may have an upper surface that is substantially flat, and as shown in FIG. 11, the upper surface of the encapsulation layer 240 may be parallel with the upper surface of the overcoat layer 190 of the optical filter substrate 100. As an embodiment, the upper surface of the encapsulation layer 240 may be in direct contact with the upper surface of the overcoat layer 190. Alternatively, an adhesive layer may be arranged between the upper surface of the encapsulation layer 240 and the overcoat layer 190 for connecting the encapsulation layer 240 and the overcoat layer 190.

As an embodiment, the diode 230 corresponding to each of the first to third regions A1, A2, and A3 may emit blue light. The blue light emitted from the light source substrate 200 may be provided as red light $L_R$, green light $L_G$, and blue light $L_B$ after passing through the optical filter substrate 100. In the first region A1 corresponding to a red pixel area, an aperture ratio of the optical filter substrate 100 may be dependent upon a width of the first coating element 171, as described above.

A width of each of the first to third openings OP1, OP2, and OP3 corresponding respectively to the first to third regions A1, A2, and A3 may be greater than a size of each opening in the optical filter substrate 100, so that the light (e.g., blue light) emitted from the light source substrate 200 may be sufficiently provided to the optical filter substrate 100. For example, a width of the first opening OP1 may be greater than the width of the first coating element 171. A width of the second opening OP2 and a width of the third opening OP3 may be respectively greater than the width of the second coating element 172 and the width of the third coating element 173.

It is described that the light source substrate 200 of the display device of FIG. 11 includes an OLED, but one or more embodiments are not limited thereto. The light source substrate 200 of the display device may include an inorganic light-emitting diode as will be described later with reference to FIGS. 13 and 14.

Figure 13:
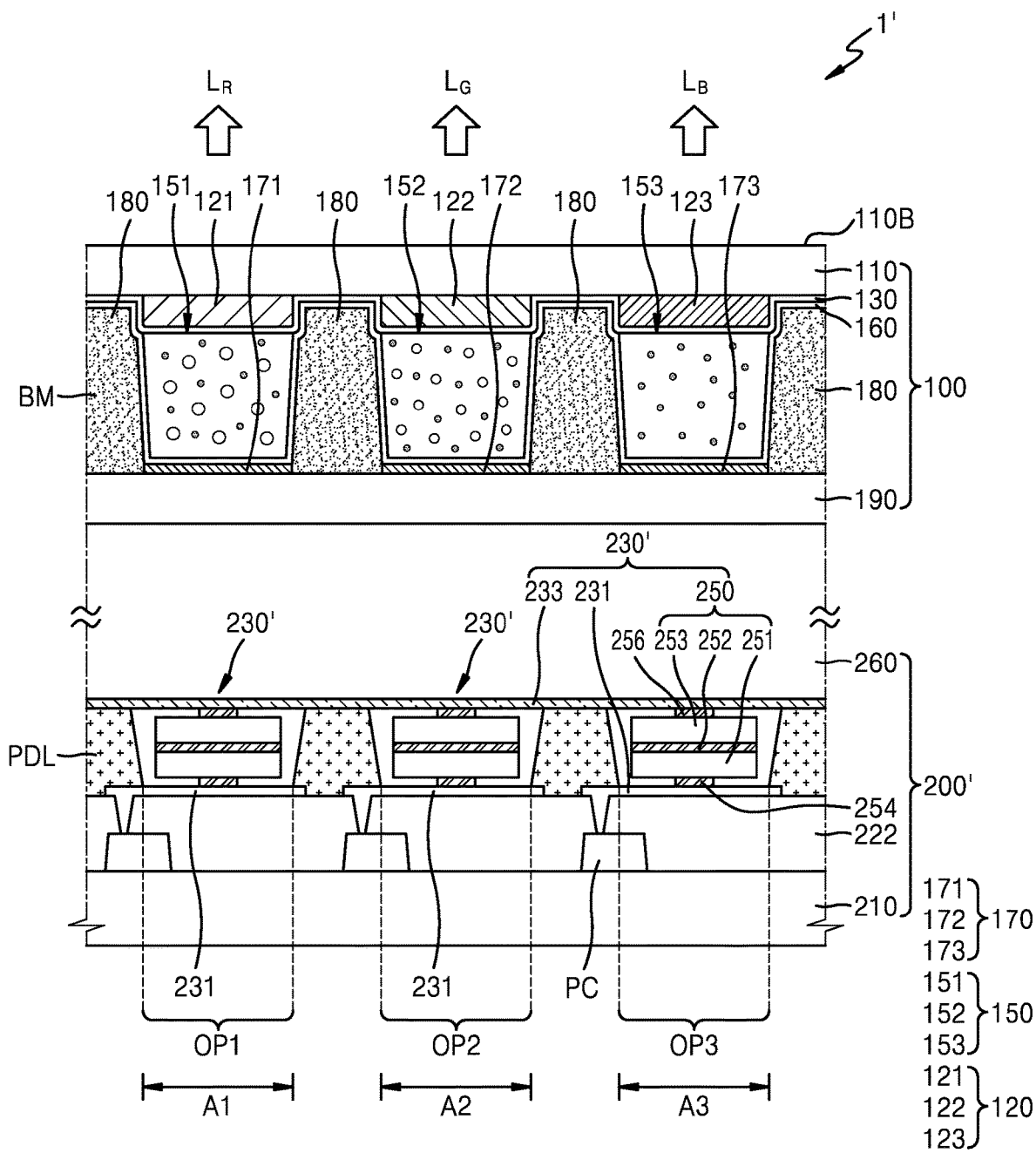
FIG. 13 is a cross-sectional view of a display device according to another embodiment.

FIG. 13 is a cross-sectional view of a display device 1' according to another embodiment.

Referring to FIG. 13, the display device 1' may include the optical filter substrate 100 and a light source substrate 200' facing the optical filter substrate 100. FIG. 13 shows the optical filter substrate 100 described above with reference to FIG. 8, but is not limited thereto. As another embodiment, the display device 1' may include the optical filter substrate according to one of the embodiments illustrated in FIGS. 8 to 10, or another optical filter substrate modified therefrom. Characteristics of the optical filter substrate 100 are described above and thus the light source substrate 200' will be described below.

In the light source substrate 200' of FIG. 13, a stack structure from the second substrate 210 and the pixel defining layer PDL is the same as that illustrated with reference to FIGS. 11 and 12. Hereinafter, differences of the light source substrate 200' from the light source substrate 200 will be described below.

A diode 230' may include the first electrode 231, the second electrode 233, and an emission layer 250 arranged between the first and second electrodes 231 and 233. The diode 230' arranged in each of the first to third regions A1, A2, and A3 may emit blue light. The emission layer 250 may include a first semiconductor layer 251, a second semiconductor layer 253, and an intermediate layer 252 disposed between the first and second semiconductor layers 251 and 253.

The first semiconductor layer 251 may include, for example, a p-type semiconductor layer. The p-type semiconductor layer may include a semiconductor material having a composition formula of $InAl_yGa_{1-x-y}N$ ($0 \le x \le 1$, $0 \le y \le 1$, $0 \le x+y \le 1$), for example, one of GaN, AlN, AlGaN, InGaN, InN, InAlGaN, and AlInN, and may be doped with a p-type dopant such as Mg, Zn, Ca, Sr, and Ba.

The second semiconductor layer 253 may include, for example, an n-type semiconductor layer. The n-type semiconductor layer may include a semiconductor material having a composition formula of $InAl_yGa_{1-x-y}N$ ($0 \le x \le 1$, $0 \le y \le 1$, $0 \le x+y \le 1$), for example, selected from GaN, AlN, AlGaN, InGaN, InN, InAlGaN, and AlInN, and may be doped with an n-type dopant such as Si, Ge, and Sn. One or more embodiments are not limited the above example, that is, the first semiconductor layer 251 may include an n-type semiconductor layer, and the second semiconductor layer 253 may include a p-type semiconductor layer.

The intermediate layer 252 is a region where electrons and holes recombine, and when the electrons and the holes recombine, an energy level is transited to a lower energy level to generate light having a wavelength corresponding to a transited energy level (e.g., blue light). The intermediate layer 252 may include, for example, a semiconductor material having a composition formula of $In_xAl_yGa_{1-x-y}N$ ($0 \le x \le 1$, $0 \le y \le 1$, $0 \le x+y \le 1$), and may have a single quantum well structure or a multi quantum well (MQW) structure. Also, the intermediate layer 252 may have a quantum wire structure or a quantum dot structure.

The emission layer 250 may be connected to the first electrode 231 via a first electrode pad 254 and may be connected to the second electrode 233 via a second electrode pad 256. In processes of manufacturing the light source substrate 200, the emission layer 250 may be a sub-diode obtained through a separate process and may be arranged on each of the first electrodes 231.

A protective layer 260 may be formed on the second electrode 233. The protective layer 260 may cover the second electrode 233 and may include an inorganic insulating material and/or an organic insulating material. The protective layer 260 may be an adhesive layer. For example, the protective layer 260 may include an inorganic insulating material and/or an organic insulating material having an adhesive force, and in this case may connect the optical filter substrate 100 to the light source substrate 200'.

The emission layer 250 of FIG. 13 is a vertical type sub-diode, in which the first electrode pad 254 and the second electrode pad 256 are arranged opposite to each other, but one or more embodiments are not limited thereto. As will be described later with reference to FIG. 14, the emission layer 250 may be a sub-diode of a horizontal type or a flip-type.

Figure 14:
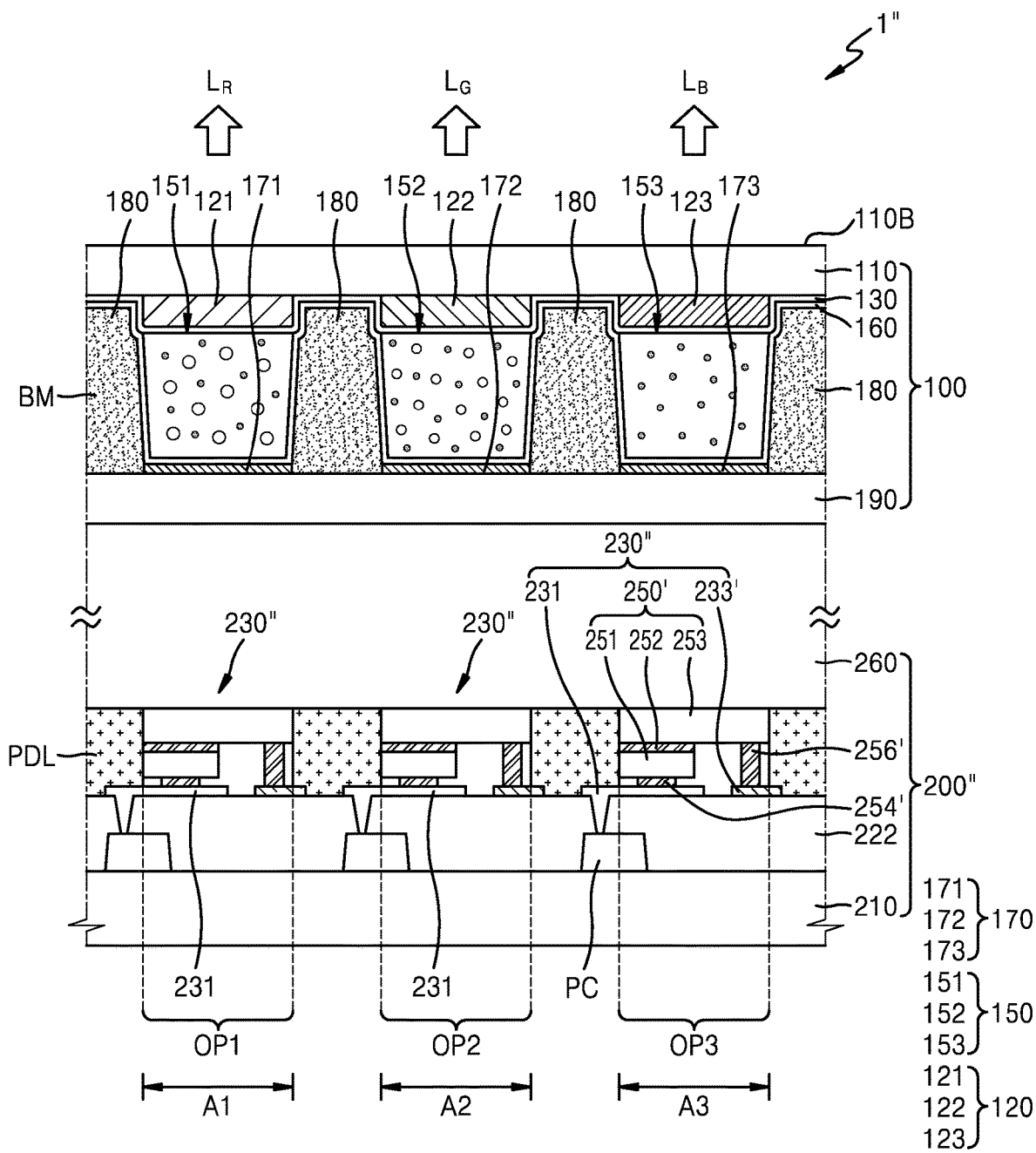
FIG. 14 is a cross-sectional view of a display device according to another embodiment.

FIG. 14 is a cross-sectional view of a display device 1" according to another embodiment.

Referring to FIG. 14, the display device 1" may include the optical filter substrate 100 and a light source substrate 200" facing the optical filter substrate 100. FIG. 14 shows the optical filter substrate 100 described above with reference to FIG. 8, but is not limited thereto. As another embodiment, the display device 1" may include the optical filter substrate according to one of the embodiments illustrated in FIGS. 8 to 10, or another optical filter substrate modified therefrom. Characteristics of the optical filter substrate 100 are described above and thus the light source substrate 200" will be described below.

An emission layer 250' of the light source substrate 200" may have a sub-diode structure of a horizontal type or a flip type. For example, the emission layer 250' may include the first semiconductor layer 251, the second semiconductor layer 253, and the intermediate layer 252 disposed between the first and second semiconductor layers 251 and 253. A first electrode pad 254' is arranged on the first semiconductor layer 251 and a second electrode pad 256' is arranged on the second semiconductor layer 253, and the first and second electrode pads 254' and 256' may extend towards a same direction.

The first electrode pad 254' may be connected to the first electrode 231 arranged on the insulating layer 222 and the second electrode pad 256' may be connected to the second electrode 233' arranged on the insulating layer 222. Unlike the second electrode 233 described above with reference to FIGS. 11 and 13, a second electrode 233' shown in FIG. 14 may be arranged on the insulating layer 222 being separated from the first electrode 231. An edge of the second electrode 233' may be covered by the pixel defining layer PDL.

The diodes 230" may be covered by the protective layer 260. The protective layer 260 may include an inorganic insulating material and/or an organic insulating material. The protective layer 260 may be an adhesive layer. For example, the protective layer 260 may include an inorganic insulating material and/or an organic insulating material having an adhesive force, and in this case may connect the optical filter substrate 100 to the light source substrate 200".

According to the optical filter substrate of one or more embodiments, color purity may be improved by using the black matrix and color mixture may be prevented. Also, a location of the black matrix between neighboring regions may be accurately adjusted by using a hydrophobic coating element. In addition, the display device may emit light of different colors from different pixel areas by using the optical filter substrate.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display comprising:
   a substrate;
   a plurality of diodes on the substrate;
   an encapsulation layer covering the plurality of diodes;
   a color filter layer on the encapsulation layer;
   a first color conversion element disposed between the encapsulation layer and the color filter layer, the first color conversion element converting incident light into light of a first color;
   a second color conversion element disposed between the encapsulation layer and the color filter layer, the second color conversion element converting incident light into light of a second color;
   a refractive layer disposed between the color filter layer and the first and second color conversion elements, the refractive layer having a refractive index less than those of the first and second color conversion elements;
   a first barrier layer disposed between the color filter layer and the first and second color conversion elements;
   a black matrix disposed between the first color conversion element and the second color conversion element; and
   a coating layer disposed between the refractive layer and the encapsulation layer.

2. The display device of claim 1, wherein the coating layer comprises an organic material.

3. The display device of claim 1, wherein the refractive index of the refractive layer is less than about 1.4.

4. The display device of claim 1, wherein the coating layer comprises a first surface facing the substrate and a second surface opposite to the first surface, the second surface of the coating layer being substantially flat.

5. The display device of claim 4, wherein the encapsulation layer comprises:
   a first inorganic encapsulation layer;
   a second inorganic encapsulation layer; and
   an organic encapsulation layer between the first inorganic encapsulation layer and the second inorganic encapsulation layer, wherein an upper surface of the second inorganic encapsulation layer faces the second surface of the coating layer.

6. The display device of claim 1, further comprising:
   a second barrier layer between the first and second color conversion elements and the coating layer.

7. The display device of claim 6, wherein the first barrier layer and the second barrier layer each comprise at least one selected from silicon nitride, silicon oxynitride, and silicon oxide.

8. The display device of claim 7, wherein the black matrix contacts parts of the second barrier layer.

9. The display device of claim 1, wherein the color filter layer comprises:
   a first color filter element overlapping the first color conversion element; and
   a second color filter element overlapping the second color conversion element, wherein the first color filter element and the second color filter have different colors from each other.

10. The display device of claim 1, wherein:
    the plurality of diodes each emits light of a third color, and
    the first color conversion element converts the light of the third color into light of the first color, and the second color conversion element converts the light of the third color into light of the second color.

11. The display device of claim 10, further comprising:
    a transmission element arranged adjacent to the first color conversion element or the second color conversion element, wherein the transmission element transmits the light of the third color and includes scattering particles.

12. The display device of claim 11, wherein the scattering particles of the transmission element comprise titanium oxide.

13. The display device of claim 1, wherein the plurality of diodes comprises a plurality of organic light-emitting diode or a plurality of inorganic light-emitting diode.

* * * * *